(12) United States Patent
Yamazaki

(10) Patent No.: US 8,760,337 B2
(45) Date of Patent: Jun. 24, 2014

(54) SOLID-STATE IMAGE SENSING DEVICE

(71) Applicant: Canon Kabushiki Kaisha, Tokyo (JP)

(72) Inventor: Kazuo Yamazaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/748,111

(22) Filed: Jan. 23, 2013

(65) Prior Publication Data

US 2013/0207825 A1    Aug. 15, 2013

(30) Foreign Application Priority Data

Feb. 9, 2012  (JP) ................................ 2012-026421

(51) Int. Cl.
*H03M 1/12* (2006.01)

(52) U.S. Cl.
USPC .......................................... 341/156; 341/155

(58) Field of Classification Search
USPC ........... 341/144, 155, 172, 156; 348/294, 302
See application file for complete search history.

(56) References Cited

U.S. PATENT DOCUMENTS

| | | | |
|---|---|---|---|
| 5,801,657 A * | 9/1998 | Fowler et al. ................. | 341/155 |
| 6,222,478 B1 * | 4/2001 | Bright ............................ | 341/162 |
| 7,423,790 B2 | 9/2008 | Kochi et al. .................... | 358/513 |
| 8,049,799 B2 | 11/2011 | Sonoda et al. ................. | 348/294 |
| 8,111,312 B2 * | 2/2012 | Sato ................................ | 348/302 |
| 8,325,260 B2 | 12/2012 | Yamazaki et al. ............. | 348/308 |
| 2005/0195304 A1 * | 9/2005 | Nitta et al. ..................... | 348/308 |
| 2008/0136948 A1 * | 6/2008 | Muramatsu .................... | 348/294 |
| 2012/0038343 A1 | 2/2012 | Takagi et al. .................. | 323/299 |

FOREIGN PATENT DOCUMENTS

JP    2007-243324 (A)    9/2007

* cited by examiner

*Primary Examiner* — Brian Young

(74) *Attorney, Agent, or Firm* — Fitzpatrick, Cella, Harper & Scinto

(57) ABSTRACT

A solid-state image sensing device comprises a pixel which outputs a pixel signal, a first conversion unit which converts the pixel signal into a digital signal with a first bit length, and a second conversion unit which converts, into a digital signal with a second bit length, an analog signal obtained by subtracting, from the pixel signal, an analog signal corresponding to the digital signal with the first bit length. The second conversion unit comprises a current source, a first capacitance, and a switching unit for switching a supply destination of a current supplied from the current source to one of the first capacitance and a reference potential. The second conversion unit performs the conversion based on comparison between a reference voltage and the analog signal which is charged in the first capacitance and is obtained as a subtraction result.

9 Claims, 9 Drawing Sheets

SOLID-STATE IMAGE SENSING DEVICE

BACKGROUND OF THE INVENTION

1. Field of the Invention

The present invention relates to a solid-state image sensing device and, more particularly, to a solid-state image sensing device including an analog to digital converting device.

2. Description of the Related Art

Some solid-state image sensing devices include a column parallel type analog to digital converting device (to be simply referred to as an "ADC" hereinafter) arranged at the output of a vertical signal line. Examples of the ADC are a counter ramp ADC that uses single slope architecture, and a successive approximation ADC.

Japanese Patent Laid-Open No. 2007-243324 (literature 1) describes a technique of using two ADCs to convert an analog signal into an n-bit digital signal. That is, the first ADC performs analog to digital conversion (to be referred to as "AD conversion" hereinafter) for the m most significant bits, and performs digital to analog conversion (to be referred to as "DA conversion" hereinafter) for an m-bit digital signal. An analog signal obtained by subtracting a signal value as the result of the DA conversion is input to the second ADC, which then performs AD conversion for the n-m least significant bits.

That is, the technique described in literature 1 shortens the time required to perform AD conversion for n bits by separating it into two processes in which the first ADC performs AD conversion for a bit length of m bits and the second ADC performs AD conversion for a bit length of n-m bits. Furthermore, the technique described in literature 1 samples a voltage corresponding to the bit length of n-m bits of the second ADC by charging a capacitor, and executes gain processing for the sampled voltage.

In the second ADC of literature 1, a constant-current source is arranged for each column. As the current of the constant-current source varies, the amount of electric charge of the capacitor also varies, thereby causing a conversion error. That is, a variation in current of the constant-current source in literature 1 causes a different conversion error for each column, which is reproduced as different vertical noise for each column. In other words, a variation in current of the constant-current source deteriorates the image quality of an image output by a solid-state image sensing device.

SUMMARY OF THE INVENTION

In one aspect, a solid-state image sensing device comprising: a pixel configured to output a pixel signal; a first conversion unit configured to convert the pixel signal into a digital signal with a first bit length; and a second conversion unit configured to convert, into a digital signal with a second bit length, an analog signal obtained by subtracting, from the pixel signal, an analog signal corresponding to the digital signal with the first bit length, wherein the second conversion unit comprises a current source, a first capacitance, and a switching unit for switching a supply destination of a current supplied from the current source to one of the first capacitance and a reference potential, and performs the conversion based on comparison between a reference voltage and the analog signal which is charged in the first capacitance and is obtained as a subtraction result.

According to the aspect, it is possible to suppress a variation in current supplied from a current source, and decrease a conversion error in analog to digital conversion.

Further features of the present invention will become apparent from the following description of exemplary embodiments with reference to the attached drawings.

DESCRIPTION OF THE EMBODIMENTS

Figure 1:
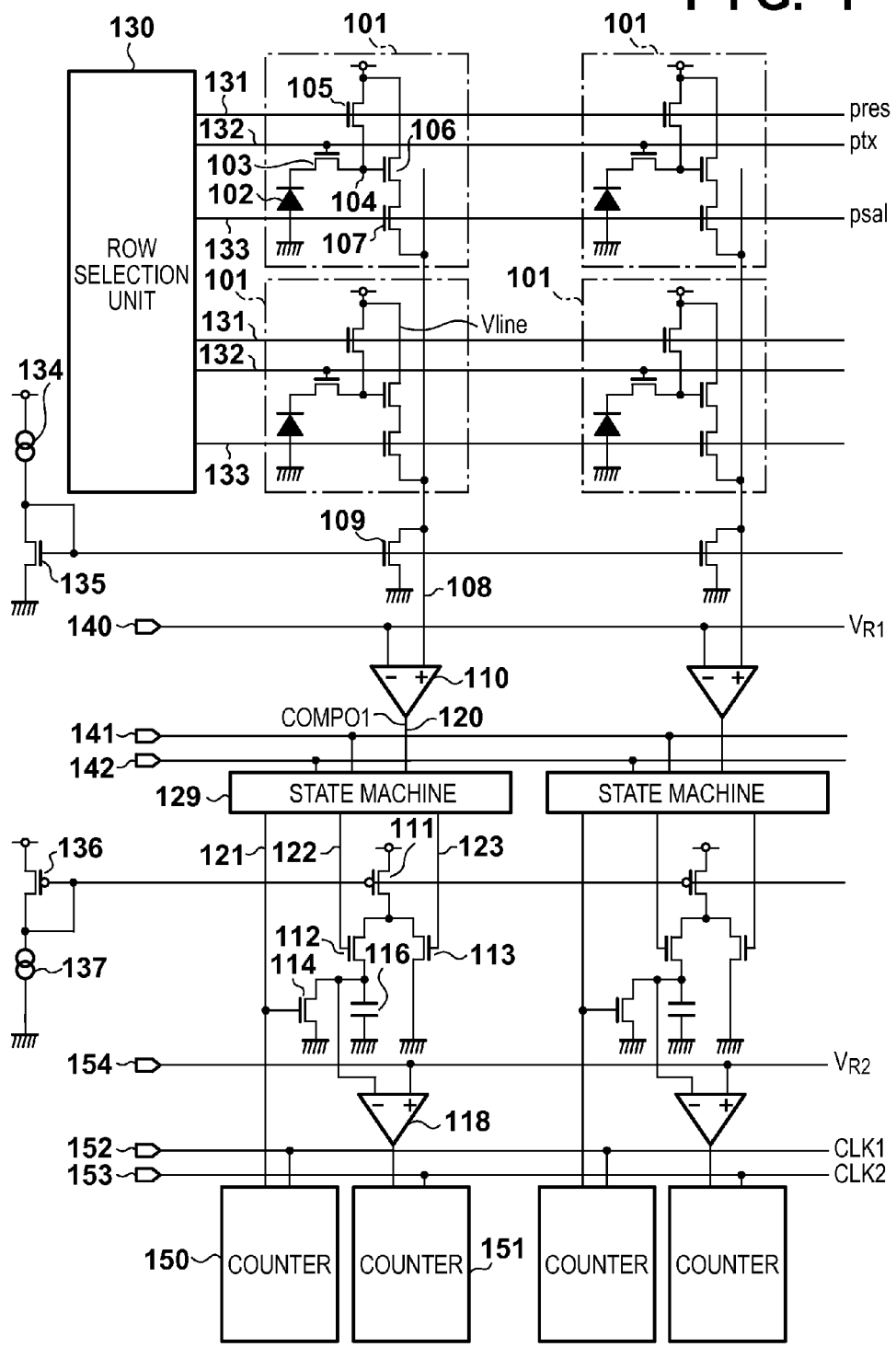
FIG. 1 is a circuit diagram for explaining the circuit arrangement of a solid-state image sensing device including an ADC according to the first embodiment.

Before explaining embodiments of the present invention, main factors that cause a variation in current of a constant-current source for each column and may occur in the arrangement described in patent literature 1 will be described. A drain current Id when using a transistor as a current source is given by:

$$Id = \mu Cox(W/L)(|V_{GS}| - |V_T|)^2/2 \qquad (1)$$

where μ represents the electron mobility,

Cox represents the thickness of a gate oxide film,

W represents the gate width,

L represents the gate length, $V_{GS}$ represents the gate-to-source voltage, and $V_T$ represents the threshold voltage.

Since the threshold voltage $V_T$ of the transistor of each column varies, the drain current Id varies for each transistor even if all other parameters are constant.

Furthermore, when using the transistor as a current source, the gate-to-source voltage $V_{GS}$ needs to be constant. In fact, however, the gate-to-source voltage $V_{GS}$ is not constant. This is because even if an attempt to supply the same gate voltage and source voltage to the transistor of each column is made, a different voltage is actually applied in each column.

For a sensor with two million pixels, the number of columns is about 2000. If a constant current of 5 μA is applied to each column, the sum of the currents flowing through all the columns is 10 mA. If the current source is formed by a PMOS transistor, the source voltage is equal to a power supply voltage. Ideally, the same voltage is applied to the sources of all the columns. However, there is a line resistance in a line connecting the sources of the transistors of the respective columns. Assume, for example, that the resistance of a power supply line between an end column and a central column is 5Ω. In this case, a voltage drop of about 50 mV occurs across the end column and the central column. On the other hand, since no current flows through the gate, the gate voltage does not drop, and the gate-to-source voltage $V_{GS}$ of the central column becomes 50 mV lower than that of the end column. That is, the drain current Id represented by equation (1) of the central column is smaller than that of the end column.

Furthermore, the drain current Id flowing through each column varies due to a voltage drop caused by the resistance of the power supply line. That is, every time the drain current changes, the source voltage also changes, thereby causing a variation in gate-to-source voltage $V_{GS}$.

In the technique described in patent literature 1, the constant-current source is turned off upon completion of charging of a capacitance. The timing when the current source is turned off during AD conversion of the m most significant bits by the first ADC is different for each column. Therefore, the constant-current sources of some of the columns are off and those of the other columns are on.

Assume, for example, that the constant-current sources of 1000 of 2000 columns are turned off, and those of the remaining 1000 columns remain on. In this case, the total sum of the drain currents Id flowing through all the columns suddenly changes from 10 mA to 5 mA. As a result, the above-described voltage drop due to the resistance of the power supply line also changes suddenly. That is, in the technique described in patent literature 1, before and after completion of the charging of the capacitance, the gate-to-source voltage $V_{GS}$ of a column in which the constant-current source remains on increases. After completion of the charging, the current of the column increases.

As described above, in the technique of patent literature 1, the timing when the constant-current source is turned off is different for each column, and changes depending on the luminance of an object to be captured. If, for example, an object which is partly dark and is partly bright is captured, the constant-current sources of columns corresponding to the dark portion are immediately turned off, and the currents of columns corresponding to the bright portion change, thereby deteriorating the image quality. Furthermore, since a conversion error amount in AD conversion changes due to the luminance of received light in each of other columns, an influence on the image quality is big, and it is difficult to correct the error.

A change in current due to an excessive variation in power supply voltage tends to occur particularly in the data read circuit of a solid-state image sensing device in which a constant-current source is arranged in each column. The turn-off timing of the constant-current source of each column which depends on the luminance of an object is a problem specific to the data read circuit of the solid-state image sensing device.

First Embodiment

A solid-state image sensing device including an analog to digital converting device (ADC), and a driving method therefor according to an embodiment of the present invention will be described in detail below with reference to the accompanying drawings.

Note that a case in which a pixel is formed by an n-channel transistor will be described below. If, however, a pixel is formed by a p-channel transistor, the present invention is also applicable by inverting the polarity of a voltage to be supplied to the transistor with respect to the case in which the pixel is formed by an n-channel transistor.

[Circuit Arrangement]

The circuit arrangement of the solid-state image sensing device including the ADC according to the first embodiment will be described with reference to a circuit diagram shown in FIG. 1.

A pixel 101 generates an analog signal based on incident light by performing photoelectric conversion. Note that FIG. 1 shows the arrangement of an area sensor including 2×2 pixels 101.

In the pixel 101, a photodiode (PD) 102 serves as a photoelectric conversion unit for converting the amount of incident light into an amount of electric charge through photoelectric conversion. A transfer transistor 103 has a source electrically connected to the PD 102, a gate electrically connected to a transfer control line 132, and a drain electrically connected to a floating diffusion region (to be simply referred to as an "FD region" hereinafter) 104. Note that the FD region 104 holds the electric charge transferred from the PD 102 via the transfer transistor 103.

A reset transistor 105 has a source electrically connected to the FD region 104, a gate electrically connected to a reset control line 131, and a drain electrically connected to a power supply voltage. An amplification transistor 106 has a gate electrically connected to the FD region 104, a drain electrically connected to the power supply voltage, and a source electrically connected to the drain of a select transistor 107. The select transistor 107 has a gate electrically connected to a select control line 133, a source electrically connected to a vertical signal line 108, and the drain electrically connected to the source of the amplification transistor 106.

The amplification transistor 106 amplifies an analog signal based on the amount of electric charge held in the FD region 104 serving as the gate portion of the amplification transistor 106, and outputs it to the vertical signal line 108 via the select transistor 107. The reset control line 131, transfer control line 132, and select control line 133 are electrically connected to a row selection unit 130.

A load transistor 109 has a drain electrically connected to the vertical signal line 108, and serves as a constant-current source for supplying a constant current to the vertical signal line 108. The gate of the load transistor 109 is electrically connected to that of a transistor 135, and the sources of both the transistors are connected to a ground voltage, thereby forming a current mirror circuit. A constant-current source 134 is electrically connected between the power supply voltage and the gate and drain of the transistor 135.

A comparator 110 has a non-inverting input terminal (to be referred to as a "positive terminal" hereinafter) electrically connected to the vertical signal line 108, and an inverting input terminal (to be referred to as a "negative terminal" hereinafter) electrically connected to a first ramp reference voltage 140 (to be described in detail later). The comparator 110 compares a voltage V+ of the positive terminal with a voltage V− of the negative terminal. If the voltage V+ is higher than the voltage V−(V+>V−), the comparator 110 outputs a voltage at high level H to a signal line 120. On the other hand, if V+≤V−, the comparator 110 outputs a voltage at low level L to the signal line 120.

A state machine 129 is electrically connected to the signal line 120 to receive the output of the comparator 110, and also receives control pulses 141 and 142, thereby outputting signals 121, 122, and 123 (to be described in detail later). Note that the signals 122 and 123 have an inverse relationship.

The gate of a transistor 136 is electrically connected to that of a transistor 111, and the sources of both the transistors are connected to the power supply voltage, thereby forming a current mirror circuit. A constant-current source 137 is electrically connected between the ground voltage and the gate and drain of the transistor 136.

A switch 112 is turned on or off according to the signal 122 input to its gate. A switch 113 is turned on or off according to the signal 123 input to its gate. A switch 114 is turned on or off according to the signal 121 input to its gate. A capacitance 116 is electrically connected between the ground voltage and the connection point of the switches 112 and 114.

That is, the switches 112 and 113 serve as a switching unit for switching the supply destination of the drain current of the transistor 111 serving as a constant-current source between the capacitance 116 and the ground voltage. The switch 114 serves as a mechanism for removing an electric charge accumulated in the capacitance 116. That is, when the switch 114 is off, the capacitance 116 accumulates a electric charge (is charged). On the other hand, when the switch 114 is on, the electric charge accumulated in the capacitance 116 is removed (discharged) to the ground voltage.

Note that the supply destination of the drain current of the transistor 111 when the switch 113 is on is not limited to the ground voltage, and it is only necessary to output the drain current of the transistor 111. That is, the connection destination of the output of the switch 113 is not limited to the ground voltage, and may be a reference potential such as a fixed voltage other than the ground voltage. Alternatively, the output of the switch 113 may be connected to the ground voltage or fixed voltage via a resistor element. Although the transistor 111 serving as a constant-current source is described as one transistor, using a common gate circuit enables to keep a drain-to-source voltage $V_{DS}$ of the transistor 111 constant, thereby supplying a more stable current.

A comparator 118 has a positive terminal electrically connected to a second ramp reference voltage 154 (to be described in detail later), and a negative terminal electrically connected to the connection point of the switches 112 and 114 and the capacitance 116. If the voltage V+ of the positive terminal is higher than the voltage V− of the negative terminal (V+>V−), the comparator 118 outputs a voltage at high level H to a counter 151 (to be described later). On the other hand, if V+≤V−, the comparator 118 outputs a voltage at low level L to the counter 151.

A counter 150 serves as a counter for a first conversion unit (ADC) for performing AD conversion for the m most significant bits. A pulse signal 152 is input as a clock to the counter 150, and the signal 121 controls to stop counting. That is, the first ADC performs AD conversion for a pixel signal to obtain a digital signal with a first bit length.

The counter 151 serves as a counter for a second conversion unit (ADC) for performing AD conversion for the n-m least significant bits. A pulse signal 153 is input as a clock to the counter 151, and the output of the comparator 118 controls to stop counting. That is, the second ADC performs AD conversion for an analog signal obtained by subtracting, from the pixel signal, an analog signal corresponding to the digital signal with the first bit length, thereby obtaining a digital signal with a second bit length.

Each of the counters 150 and 151 has, for example, a function of performing a count reset control operation and an operation of switching between counting up and counting down. This function is not directly associated with the present invention, and a detailed description thereof will be omitted. A horizontal scanning circuit or the like is generally used to read out the count value of the counter 150 or 151, and a detailed description thereof will be omitted.

[Driving Method for Solid-State Image Sensing Device]

A driving method for the solid-state image sensing device will be described with reference to a timing chart shown in FIG. 2.

Figure 2:
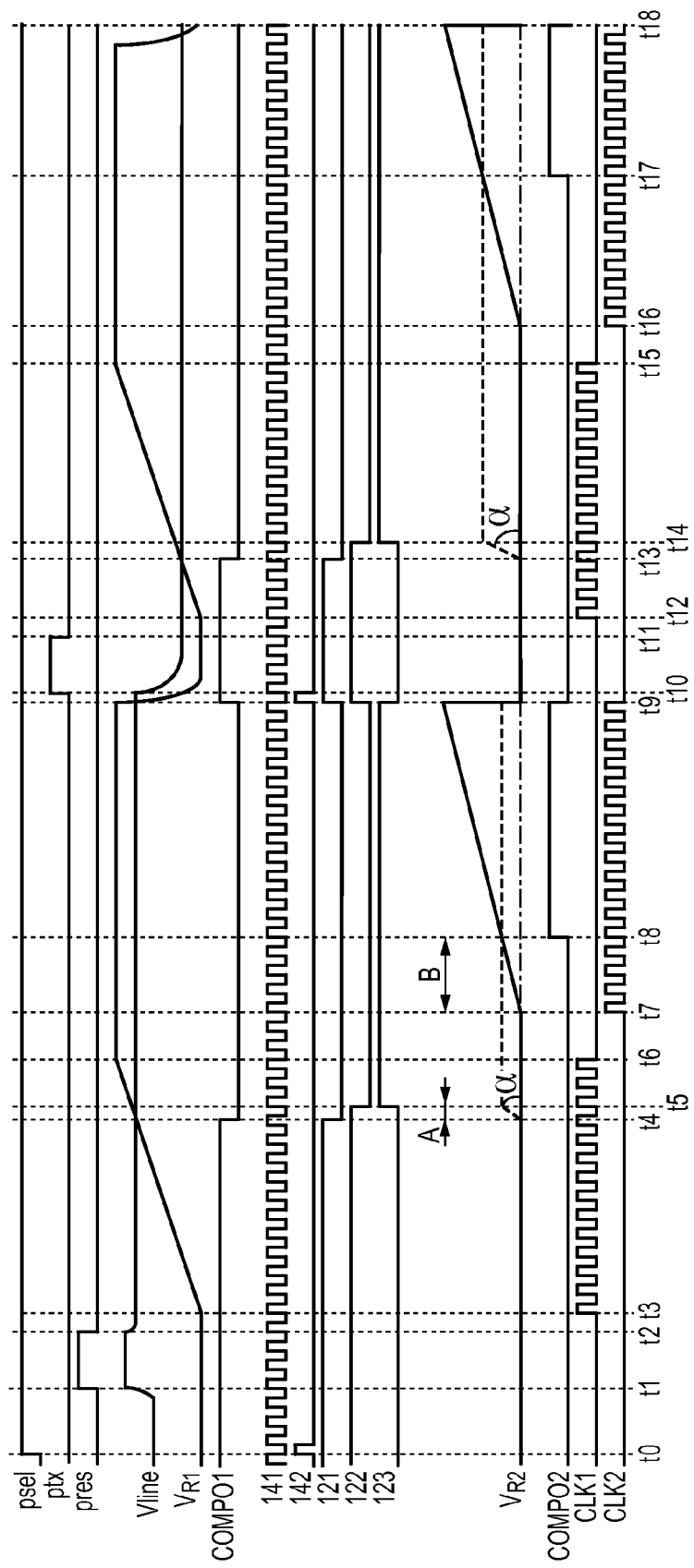
FIG. 2 is a timing chart for explaining a driving method for the solid-state image sensing device.

In FIG. 2, a signal pres represents a signal applied to the reset control line 131, a signal ptx represents a signal applied to the transfer control line 132, and a signal psel represents a signal applied to the select control line 133. A signal Vline represents the voltage of the vertical signal line 108, a signal COMPO1 represents the voltage of the output signal of the comparator 110, and a signal COMPO2 represents the voltage of the output signal of the comparator 118. A signal $V_R1$ represents the first ramp reference voltage 140, and a signal $V_R2$ represents the second ramp reference voltage 154. A signal CLK1 represents the pulse signal 152, and a signal CLK2 represents the pulse signal 153.

Furthermore, solid lines 141 and 142 in FIG. 2 indicate the control pulses 141 and 142 shown in FIG. 1, respectively. Note that a timing generator (not shown) generates the control pulses 141 and 142, and the pulse signals 152 and 153 (CLK1 and CLK2). Furthermore, solid lines 121, 122, and 123 in FIG. 2 indicate the signals 121, 122, 123 generated by the state machine 129, respectively.

Referring to FIG. 1, the source-to-drain path of a transistor having a gate which is applied with a pulse signal at high level (to be referred to as "H level" hereinafter) is enabled (the switch is turned on). On the other hand, the source-to-drain path of a transistor having a gate which is applied with a pulse signal at low level (to be referred to as "L level" hereinafter) is disabled (the switch is turned off). If a transistor having a source-to-drain path which is enabled when a pulse signal at L level is applied to its gate is used, the same operation is achieved by inverting H level and L level of the pulse signal shown in FIG. 2, as a matter of course.

The driving method for the solid-state image sensing device will be sequentially described from a time t0 in the timing chart shown in FIG. 2.

At the time t0, the signal psel of a row from which data is to be read out becomes H level, and the pixel 101 of the first row shown in FIG. 1 is selected. At a time t1, the signal pres applied to the pixel 101 is set to H level, thereby setting the FD region 104 to a reset level (almost equal to the power supply voltage). At a time t2, the signal pres is set to L level to cancel the reset state of the FD region 104.

The voltage of the FD region 104 decreases below the reset level due to charge injection occurring when the source-to-drain path of the reset transistor 105 is disabled. Therefore, the voltage of a signal output from the amplification transistor 106 decreases, and the voltage Vline of the vertical signal line 108 also decreases. At this time, $V_R1$ (the first ramp reference voltage 140) input to the negative terminal of the comparator 110 is set to be lower than the reset level, and the comparator 110 maintains the output of the signal COMPO1 at H level.

At a time t3, the voltage of $V_R1$ input to the negative terminal of the comparator 110 starts increasing with a predetermined gradient, thereby starting supplying CLK1 (the pulse signal 152) to the counter 150 for the first ADC. Note that a case in which the ramp start time of $V_R1$ and the supply start time of the clock CLK1 coincide with each other at the time t3 will be described. Shifting the start times from each other, however, enables to give an offset to a count value.

At a time t4, the relationship between the voltage of $V_R1$ input to the negative terminal of the comparator 110 and the voltage Vline input to the positive terminal via the vertical signal line 108 is reversed. The signal COMPO1 output from the comparator 110 changes from H level to L level. Note that "H→L" indicates a change from H level to L level, and "L→H" indicates a change from L level to H level in the following description.

When the COMPO1 becomes L level, the state machine 129 inverts the signal 121 (H→L), and the counter 150 for the first ADC stops counting. As a result, the count result during the time t3 to t4 is held as a count value for the first ADC. Furthermore, inverting the signal 121 (H→L) turns off the switch 114 to start charging the capacitance 116. In this case, a gradient α of an increase in amount of electric charge accumulated in the capacitance 116 (an increase in voltage) is given by:

$$\alpha = dV/dt = d(Q/C)/dt = I(t)/C1 \tag{2}$$

where I represents the charging current, and

C1 represents the capacitance of the capacitance 116.

In equation (2), the charging current I is a constant current, which is considered to be constant irrespective of time (I(t) =I).

At a time t5, at the leading edge of the control pulse 141, the signal 122 is inverted (H→L), the signal 123 is inverted (L→H), the switch 112 is turned off, and the switch 113 is turned on, thereby stopping charging the capacitance 116. The voltage of the capacitance 116 stops increasing with the gradient α, and the voltage when charging stops is maintained (which is indicated by a broken line in FIG. 2).

The time t5 indicates the timing when the state machine 129 detects H level of the control pulse 141 after the time t4. This timing will be described later together with the state machine 129. A period A during the time t4 to t5 will be referred to as a "charging period".

Furthermore, at the time t5, the switch 113 is turned on according to the signal 123, and the current I flows to the ground potential via the switch 113. In other words, switching the switches 112 and 113 changes the connection destination of the constant current supplied by the transistor 111 from the capacitance 116 to the ground potential. With this operation, the constant current supplied by the transistor 111 continues to always flow without being cut off even after the time t5. In other words, since the switching mechanism using the switches 112 and 113 switches the connection destination of the constant-current source, the current supplied from the constant-current source never stops even after the charging period of the capacitance 116 has elapsed. As a result, no current variations occur before and after end of the charging period in each column, and thus the transistor 111 can supply a stable current.

If no switching mechanism is provided, and the switch 112 is turned off at the time t5 to stop the current supplied from the constant-current source, the gradient α of an increase in voltage in another column changes. As the gradient α changes, the conversion result of the second ADC also changes, thereby causing an AD conversion error.

As described above, in this embodiment, it is possible to stably keep the constant current by supplying the constant current after charging the capacitance 116. Assume that a decrease in power supply voltage in the middle of a column changes the gate-to-source voltage $V_{GS}$ of the transistor 111, and the value of the current I supplied by the transistor 111 decreases in the middle of the column. In this case, however, the value of the current I supplied by the transistor 111 never changes before and after end of the charging period of the capacitance 116. Since, therefore, a decrease in the current I is constant, correction becomes easy, and an AD conversion error can be reduced.

At a time t6, the first ADC ends AD conversion (a first AD conversion result), an increase in $V_R1$ (the first ramp reference voltage 140) stops, and the clock CLK1 supplied to the counter 150 also stops. At a time t7, $V_R2$ (the second ramp reference voltage 154) for the second ADC starts increasing with a predetermined gradient, supply of CLK2 (the pulse signal 153) to the counter 151 for the second ADC starts.

The counter 151 counts a period B from when $V_R2$ starts increasing (the time t7) until $V_R2$ becomes higher than a voltage maintained by the capacitance 116 (the time t8 when COMPO2 changes from L level to H level (L→H)) (a second AD conversion result). In this way, it is possible to increase the resolution of AD conversion when the second ADC performs AD conversion for a difference value of AD conversion by the first ADC.

The charging period (period A) is shorter than the period B, and is difficult to be counted in AD conversion. To the contrary, the period B is longer than the period A, and is easy to be counted in AD conversion. By increasing the frequency of CLK2 (the pulse signal 153), the resolution of AD conversion by the second ADC may be increased.

At a time t9, an increase in $V_R2$ stops, and the AD conversion by the second ADC ends. At this time, CLK2 is stopped. Simultaneously, the control pulse 142 is set to H level, and the state of the state machine 129 is reset to an initial state.

At a time t10, the control pulse 142 for resetting the state machine 129 is set to L level, and the signal ptx changes from L level to H level (L→H). This operation transfers an electric charge generated by the PD 102 to the FD region 104. Based on the electric charge held in the FD region 104, a signal (to be referred to as a "photoelectric conversion signal" hereinafter) output from the amplification transistor 106 is transferred to the vertical signal line 108. According to the electric charge held in the FD region 104, the voltage Vline of the vertical signal line 108 decreases. The PD 102 need only perform photoelectric conversion between a time t11 when the signal ptx changes from H level to L level (H→L) during the last signal readout period and the time t10 during the current signal readout period.

At the time t11, the PD 102 and the FD region 104 are disabled by changing the signal ptx from H level to L level (H→L). After that, a signal level based on the electric charge generated by the PD 102 is read out, and AD conversion is performed by an operation during a time t12 to t18 similarly to that during the time t3 to t9. The operation during the time t12 to t18 is the same as that during the time t3 to t9 described above, and a detailed description thereof will be omitted.

In this way, by performing reset level AD conversion and signal level AD conversion, and obtaining a difference between them, a correlation double sampling (CDS) operation is implemented. The correlation double sampling operation may count down in noise level conversion (N conversion) and count up in signal level conversion (S conversion). Although the counters 150 and 151 are used for each column in the above example, a common counter may be used and count values may be held in a reset retention memory and signal retention memory for each column, thereby obtaining a difference between the count values.

The arrangement example in which the vertical signal line 108 is directly connected to the positive terminal of the comparator 110 has been described. A gain amplifier, however, may be arranged between the vertical signal line 108 and the comparator 110 for each column. The noise level and the photoelectric conversion level (signal level) may be amplified, and the thus obtained signal may be supplied to the positive terminal of the comparator 110.

It is possible to further improve the resolution of AD conversion when the output COMPO2 of the comparator 118 is connected to a state machine different from the state machine 129, and a third conversion unit (ADC) is used to perform third AD conversion. That is, after AD conversion by the second ADC, the third ADC subtracts, from the pixel signal, the analog signals corresponding to the first and second bit lengths, and performs AD conversion for an analog signal as a result of the subtraction operation to obtain a signal with a third bit length.

[State Machine]

Figure 3:
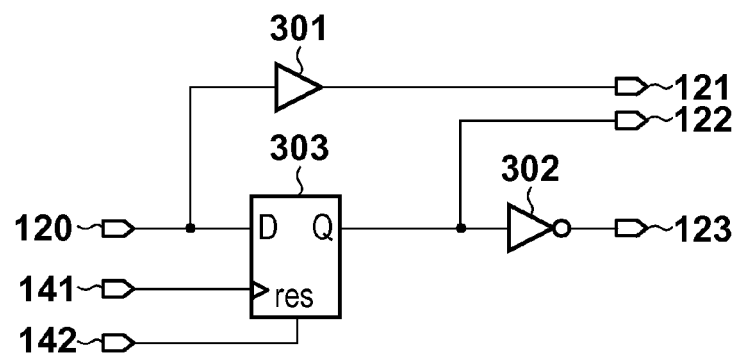
FIG. 3 is a circuit diagram for explaining the arrangement of a state machine.

An example of the arrangement of the state machine 129 will be described with reference to a circuit diagram shown in FIG. 3. The state machine 129 includes a buffer 301, an inverter 302, and a flip-flop 303.

The flip-flop 303 has a clock input terminal to which the control pulse 141 is input, an asynchronous reset terminal to which the control pulse 142 is input, and a D terminal to which the output signal COMPO1 of the comparator 110 is input through the signal line 120. If the signal COMPO1 becomes L level, the flip-flop 303 outputs the signal 122 at L level in synchronism with the leading edge of the control pulse 141. The inverter 302 outputs the signal 123 obtained by inverting the signal 122. The buffer 301 outputs the signal COMPO1 as the signal 121. The signal 121 is not synchronized to the control pulse 141. That is, the control pulse 141 functions as the operation clock of the state machine 129 of the first ADC.

As described above, it is possible to implement high accuracy AD conversion with little influence of a change in current due to an excessive variation in power supply voltage.

Second Embodiment

A solid-state image sensing device including an ADC, and a driving method therefor according to the second embodiment of the present invention will be described below. Note that in the second embodiment, the same components as those in the first embodiment have the same reference numerals, and a detailed description thereof will be omitted.

The arrangement of a state machine 129 according to the second embodiment will be described with reference to a circuit diagram shown in FIG. 4.

The state machine 129 of the second embodiment additionally includes a flip-flop 304. If a signal COMPO1 becomes L level and a control pulse 141 rises, a flip-flop 303 outputs a signal at L level. If the output of the flip-flop 303 becomes L level and the control pulse 141 rises, the flip-flop 304 outputs a signal 122 at L level. That is, after the signal COMPO1 becomes L level and the control pulse 141 rises twice, the L-level signal 122 and an H-level signal 123 synchronous with the control pulse 141 are output.

Figure 5:
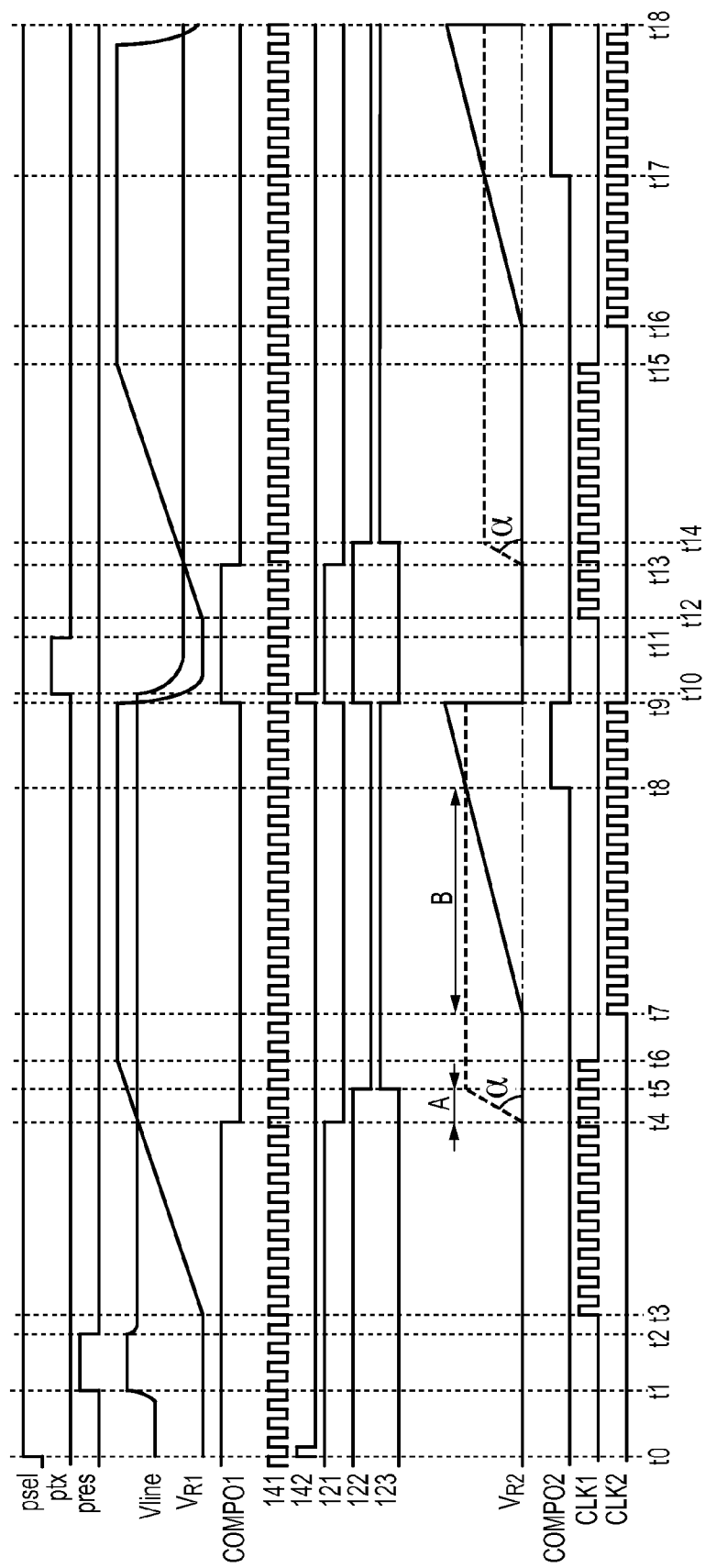
FIG. 5 is a timing chart for explaining a driving method for a solid-state image sensing device according to the second embodiment.

The driving method for the solid-state image sensing device according to the second embodiment will be described with reference to a timing chart shown in FIG. 5.

The charging period (a period A) of a capacitance 116 is a period from when a signal 121 falls until the signal 122 falls. In the second embodiment, the period A is longer than one cycle of the control pulse 141 at the minimum, and slightly exceeds two cycles of the control pulse 141 at the maximum.

When a switch 114 is turned off, the charging period starts. A variation in voltage occurring when the signal 121 changes from H level to L level (H→L) exerts an influence immediately after the switch 114 is turned off, and thus a current supplied by a transistor 111 may vary. If, however, the current becomes stable during one cycle of the control pulse 141, no AD conversion error occurs in the second ADC. If the current does not become stable during one cycle of the control pulse 141, it is only necessary to add another flip-flop to the state machine 129 to make the period A equal to or longer than two cycles of the control pulse 141.

As described above, it is possible to remove a variation period as an offset by controlling the shortest charging period of the capacitance 116 to be equal to or longer than a predetermined period, and prolonging the charging period until the variation in current supplied by the transistor 111 at the start of charging becomes stable. This improves the accuracy of AD conversion.

Setting the shortest charging period of the capacitance 116 to be equal to or longer than one cycle of the control pulse 141 generates an amount of offset charge for one cycle, which serves as an offset obtained as a result of the AD conversion by the second ADC. The amount of offset charge, however, is also an amount of offset charge in reset level AD conversion and signal level AD conversion, which can be deleted by the above-described CDS operation.

Third Embodiment

A solid-state image sensing device including an ADC, and a driving method therefor according to the third embodiment of the present invention will be described below. Note that in the third embodiment, the same components as those in the first and second embodiments have the same reference numerals, and a detailed description thereof will be omitted.

The circuit arrangement of the solid-state image sensing device including the ADC according to the third embodiment will be described with reference to a circuit diagram shown in FIG. 6. In addition to the arrangement shown in FIG. 1, the arrangement of the third embodiment includes a switch 115 having a gate to which a control pulse 124 is input, a drain electrically connected to the source of a switch 113, and a source electrically connected to a ground potential. The arrangement of the third embodiment also includes a capacitance 117 electrically connected between the ground potential and the connection point of the switches 115 and 113. Note that the control pulse 124 is generated by a timing generator (not shown).

That is, a switching mechanism according to the third embodiment turns on or off a switch to switch the supply destination of a current supplied by a transistor 111 between capacitances 116 and 117 (first and second capacitances).

The positive terminal of a comparator 118 is electrically connected to the connection point of the switch 115 and capacitance 117 instead of $V_R2$ (the second ramp reference voltage 154) of the first embodiment.

The driving method for the solid-state image sensing device according to the third embodiment will be described with reference to a timing chart shown in FIG. 7.

An operation during a time t0 to t4 is the same as that in the first embodiment, and a detailed description thereof will be omitted.

At a time t5, a signal 122 is inverted (H→L) at the leading edge of a control pulse 141, a signal 123 is inverted (L→H), a switch 112 is turned off, and the switch 113 is turned on, thereby stopping charging the capacitance 116. A voltage Vc1 of the capacitance 116, therefore, stops increasing with a gradient α, and the voltage Vc1 when charging stops is maintained (which is indicated by Vc represented by a broken line in FIG. 7).

Note that the time t5 indicates the timing when a state machine 129 detects H level of the control pulse 141 after the time t4. Details of this timing are as described in the first embodiment. A period A during the time t4 to t5 will be referred to as a "first charging period".

In the third embodiment, at the time t5, the switch 113 is turned on according to the signal 123. That is, the switching mechanism of the third embodiment changes the supply destination of a current supplied by the transistor 111 from the first capacitance side to the second capacitance side. Since, however, the control pulse 124 is at H level at this time, the switch 115 is on, and a current I flows to the ground potential via the switch 115 without charging the second capacitance. That is, the current I flows to the ground potential via the two switches 113 and 115. With this operation, the constant current supplied by the transistor 111 continues to always flow without being cut off even after the time t5. In other words, since the switching mechanism using the switches 112, 113, and 115 switches the connection destination of a constant-current source, a current supplied from the constant-current source never stops even after the charging period of the first capacitance has elapsed. As a result, no current variations occur before and after end of the charging period in each column, and thus the transistor 111 can supply a stable current.

At a time t6, the first ADC ends AD conversion (a first AD conversion result), an increase in $V_R 1$ (a first ramp reference voltage 140) stops, and a clock CLK1 supplied to a counter 150 also stops.

Figure 7:
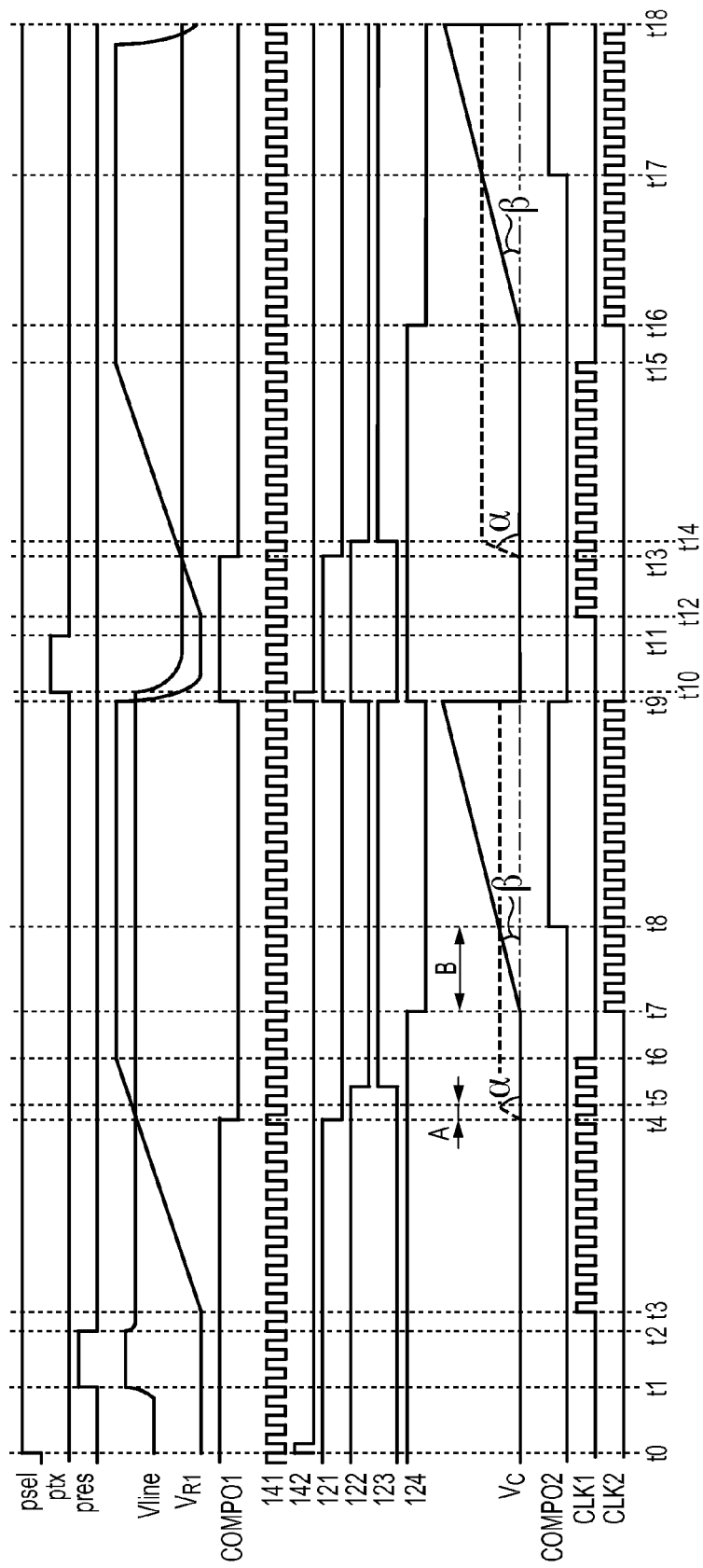
FIG. 7 is a timing chart for explaining a driving method for a solid-state image sensing device according to the third embodiment.

At a time t7, the control pulse 124 changes from L level to H level (L→H) to turn off the switch 115, thereby starting to charge the second capacitance (which is indicated by Vc represented by a solid line in FIG. 7). Note that charging the second capacitance generates a ramp reference voltage $V_R 2$ for each pixel column. The gradient α of an increase in voltage of the first capacitance 116 and a gradient β of an increase in voltage of the second capacitance 117 have the relationship represented by:

$$\beta = I(t)/C2 = C1 \cdot \alpha/C2 = \alpha \cdot C1/C2 \qquad (3)$$

where C1 represents the capacitance of the first capacitance 116, and

C2 represents the capacitance of the second capacitance 117.

Assume, for example, that a capacitance ratio C1:C2 is 1:4. In this case, the relationship between the first charging period (period A) and the second charging period (a period B during the time t7 to t8) is represented by:

$$A:B = C1:C2 = 1:4 \qquad (4)$$

That is, in this example, the second charging period is four times longer than the first charging period. By measuring the count of the second charging period as AD conversion by the second ADC, it becomes possible to perform 2-bit AD conversion as the second AD conversion. On the other hand, the first charging period is shorter than the second one, and is thus difficult to measure its count as AD conversion.

It is possible to further prolong the second charging period by changing the capacitance ratio between the first and second capacitances C1 and C2 to 1:8 or 1:16, as a matter of course. In this case, the second ADC can perform AD conversion with higher accuracy, thereby increasing the number of bits in the second ADC.

An operation at a time t9 and thereafter is the same as that in the first embodiment, and a detailed description thereof will be omitted.

In the third embodiment, the accuracy of AD conversion by the second ADC is determined according to the capacitance ratio C1:C2. This is apparent from the relationship between the gradients α and β in equations (2) and (3) described above, and is independent of the current I supplied by the transistor 111. Current variations, therefore, have little influence on the accuracy of AD conversion. It is thus possible to cancel the variations in the current I with the same current I, thereby allowing higher accuracy AD conversion.

In manufacturing a semiconductor, it is generally possible to decrease a variation in relative accuracy of a capacitance as compared with that in Id of a transistor. In consideration of this, high accuracy AD conversion is possible. Furthermore, a variation in relative accuracy of the capacitance due to a power supply voltage or temperature is generally smaller than that in Id of the transistor, thereby allowing AD conversion in which a variation due to differences in operation conditions is small.

Modification of Third Embodiment

Figure 4:
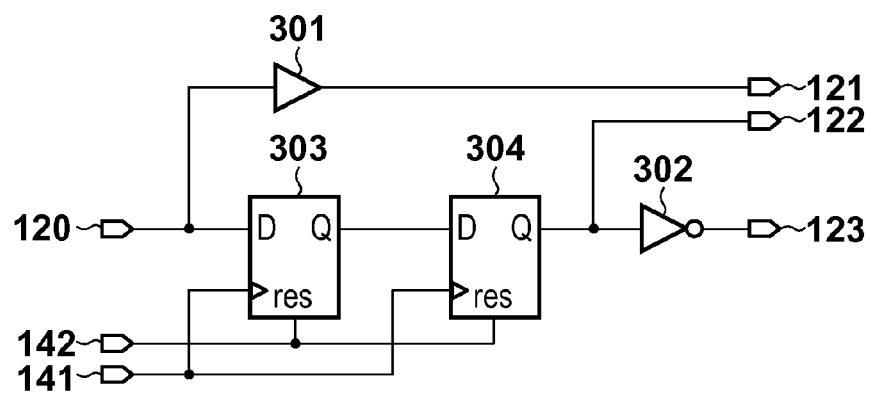
FIG. 4 is a circuit diagram for explaining the arrangement of a state machine according to the second embodiment.
Figure 6:
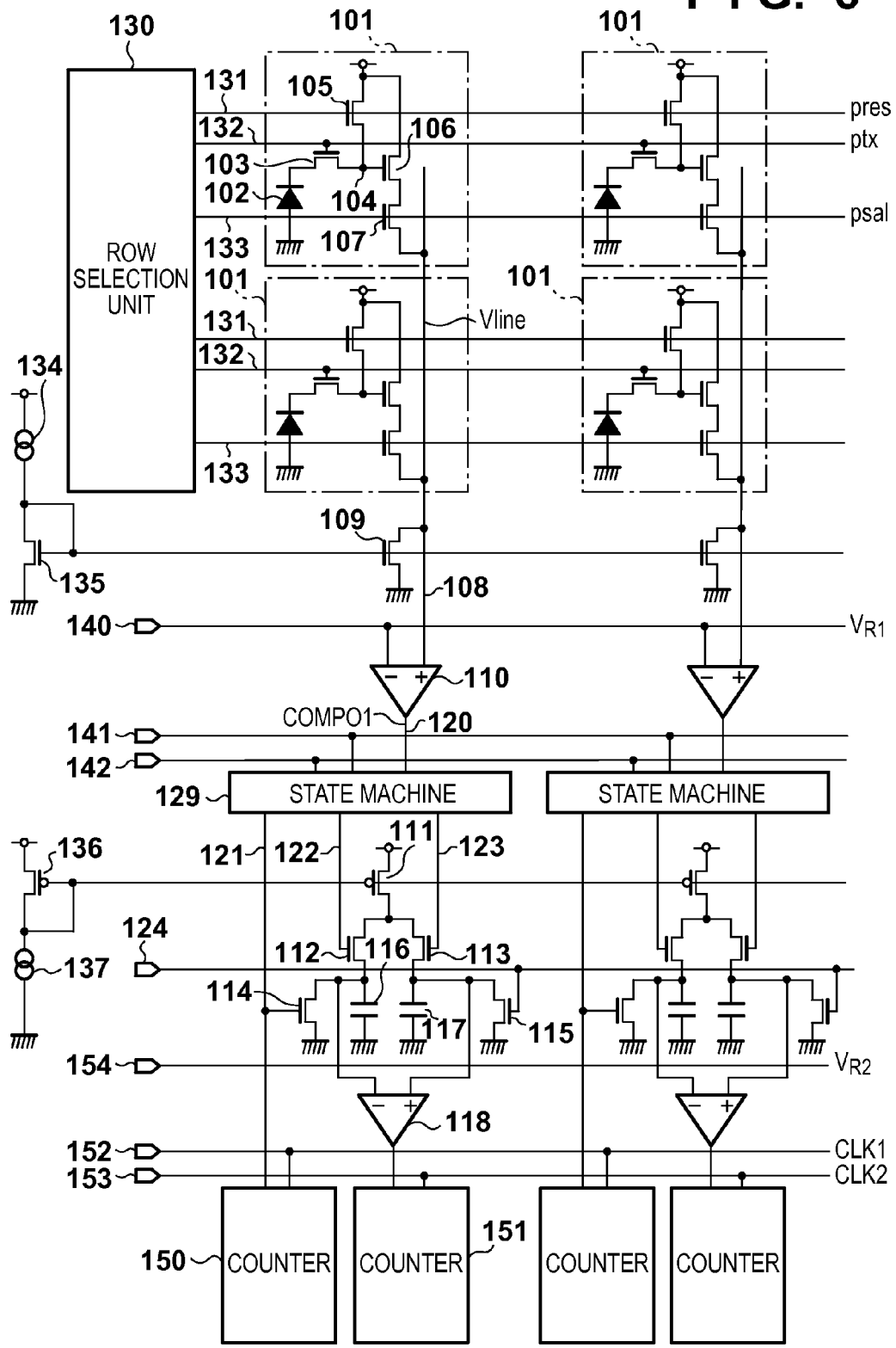
FIG. 6 is a circuit diagram for explaining the circuit arrangement of a solid-state image sensing device including an ADC according to the third embodiment.
Figure 8:
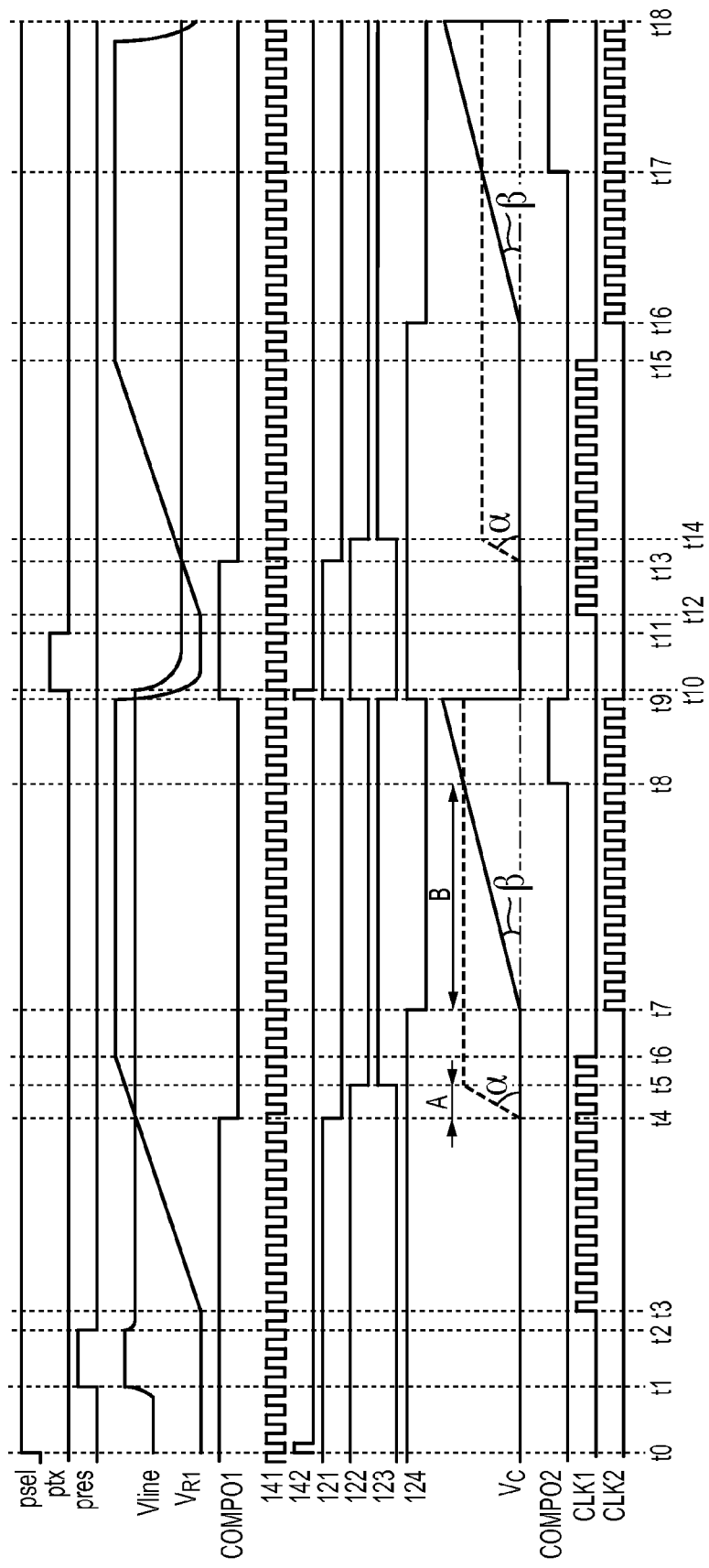
FIG. 8 is a timing chart for explaining a driving method for the solid-state image sensing device according to a modification.

The state machine 129 with the arrangement shown in FIG. 4 is applicable to the arrangement shown in FIG. 6. A driving method for the solid-state image sensing device according to a modification will be described with reference to a timing chart shown in FIG. 8.

According to this arrangement, like the second embodiment, the first charging period (period A) of the first capacitance indicates a period from when the signal 121 falls until the signal 122 falls. In terms of the cycle of the control pulse 141, the first charging period is longer than one cycle at the minimum, and slightly exceeds two cycles at the maximum.

That is, even in a method using the second capacitance, it is possible to remove a variation period as an offset by controlling the shortest period of the first charging period of the capacitance 116 to be equal to or longer than a predetermined period, and prolonging the charging period until the variation in current supplied by the transistor 111 at the start of charging becomes stable. This improves the accuracy of AD conversion.

Fourth Embodiment

A solid-state image sensing device including an ADC, and a driving method therefor according to the fourth embodiment of the present invention will be described below. Note that in the fourth embodiment, the same components as those in the first to third embodiments have the same reference numerals, and a detailed description thereof will be omitted.

Figure 9:
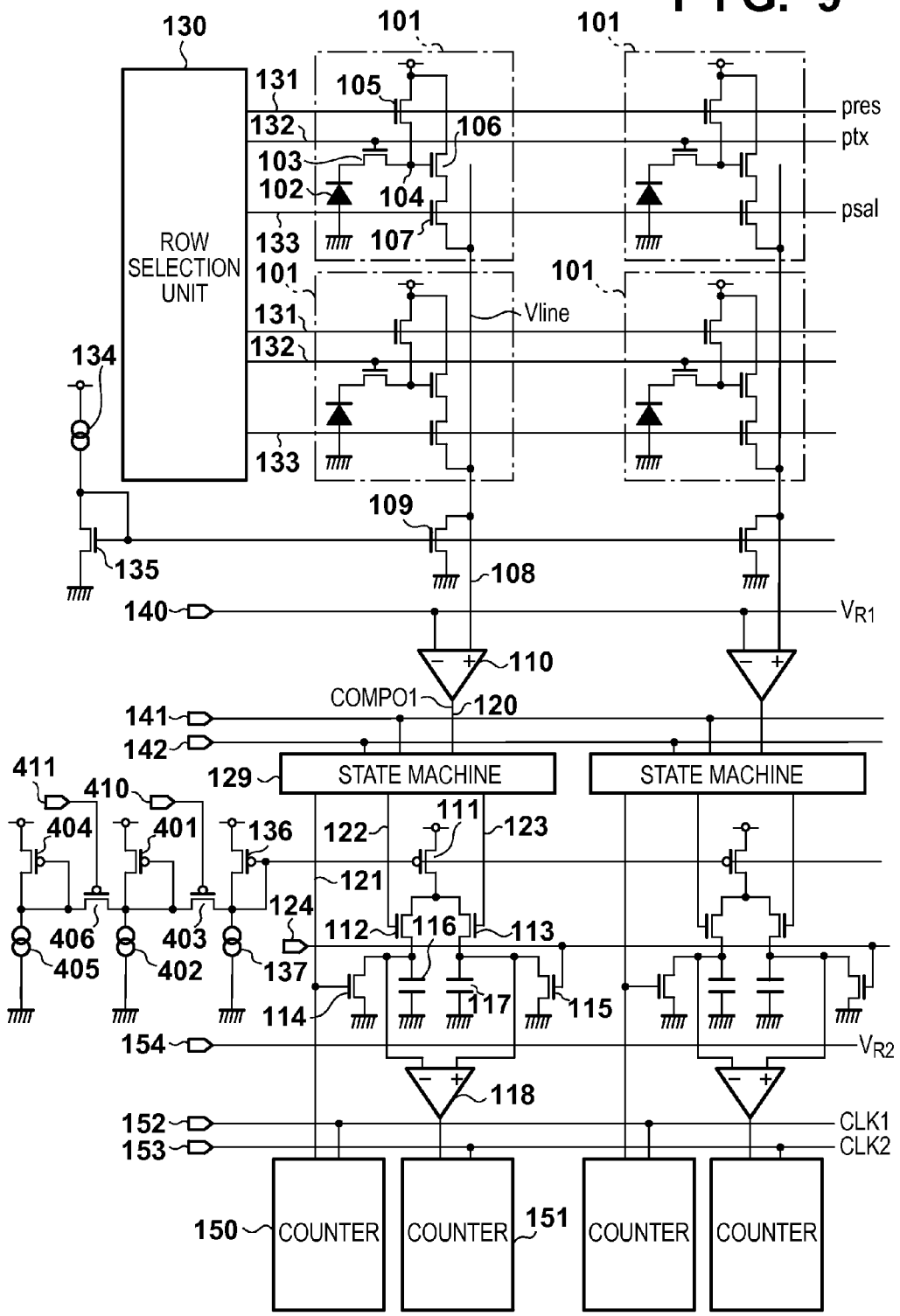
FIG. 9 is a circuit diagram for explaining the circuit arrangement of a solid-state image sensing device including an ADC according to the fourth embodiment.

An example of the circuit arrangement of the solid-state image sensing device including the ADC according to the fourth embodiment will be described with reference to a circuit diagram shown in FIG. 9. In addition to the arrangement shown in FIG. 6, the arrangement of the fourth embodiment includes a mechanism (current control unit) of switching a current supplied by a transistor 111.

A transistor 401 has a drain and gate electrically connected to a constant-current source 402, and a source electrically connected to a power supply voltage. The source-to-drain path of a switch 403, which has a gate applied with a control pulse 410, is enabled (turned on) when the control pulse 410 is at L level. When the switch 403 is on, the transistor 401 and a transistor 136 are considered as one transistor. When the switch 403 is off, the transistor 401 is isolated from a circuit including the transistors 136 and 111.

A transistor 404 has a drain and gate electrically connected to a constant-current source 405, and a source electrically connected to a power supply voltage. The source-to-drain path of a switch 406, which has a gate applied with a control pulse 411, is enabled (turned on) when the control pulse 411 is at L level. When the switch 406 is on, the transistors 404 and 401 are considered as one transistor. When the switch 406 is off, the transistor 404 is isolated from a circuit including the transistor 401. Note that the control pulses 410 and 411 are generated by a timing generator (not shown).

Assume, for example, that the ratio between the sizes of the transistors 401 and 136 is 3:1, and the ratio between the currents of the constant-current sources 402 and 137 is 3:1. Assume also that I2 represents a current flowing through a circuit forming a current mirror when the switch 403 is on, and I1 represents a current flowing when the switch 403 is off. In this case, the current value ratio is represented by:

$$I1:I2=1:4 \quad (5)$$

Assume, for example, that the ratio between the sizes of the transistors 404 and 136 is 4:1, and the ratio between the currents of the constant-current sources 405 and 137 is 4:1. Assume also that I3 represents a current flowing through a circuit forming a current mirror when the switches 403 and 406 are on, and I1 represents a current flowing when the switches 403 and 406 are off. In this case, the current value ratio is represented by:

$$I1:I3=1:8 \quad (6)$$

That is, it is possible to turn on/off the switches 403 and 406, thereby controlling to switch the current supplied by the transistor 111 to I1, I2, or I3 having a predetermined current value ratio.

The driving method for the solid-state image sensing device according to the fourth embodiment will be described with reference to a timing chart shown in FIG. 10.

During a time t0 to t20, the control pulse 411 is at H level (the switch 406 is off), the control pulse 410 is at L level (the switch 403 is on), and the transistor 111 supplies the current I2. If the control pulse 410 is set from L level to H level (L→H) at the time t20 after AD conversion by the first ADC ends, the current supplied by the transistor 111 becomes the current I1. According to the above ratio, the current supplied by the transistor 111 decreases to a quarter of the original current. The relationship between a voltage increase rate α during the first charging period (period A) and that β during the second charging period (period B) is given by:

$$\alpha = dVc1/dt = d(Q/C)/dt = I2(t)/C1$$

$$\beta = I1(t)/C2 = I2(t)/4C2 = \alpha C1/4C2$$

When C1:C2=1:1, $$\beta = \alpha/4 \quad (7)$$

where C1 represents the capacitance of the first capacitance 116, and
C2 represents the capacitance of the second capacitance 117.

Figure 10:
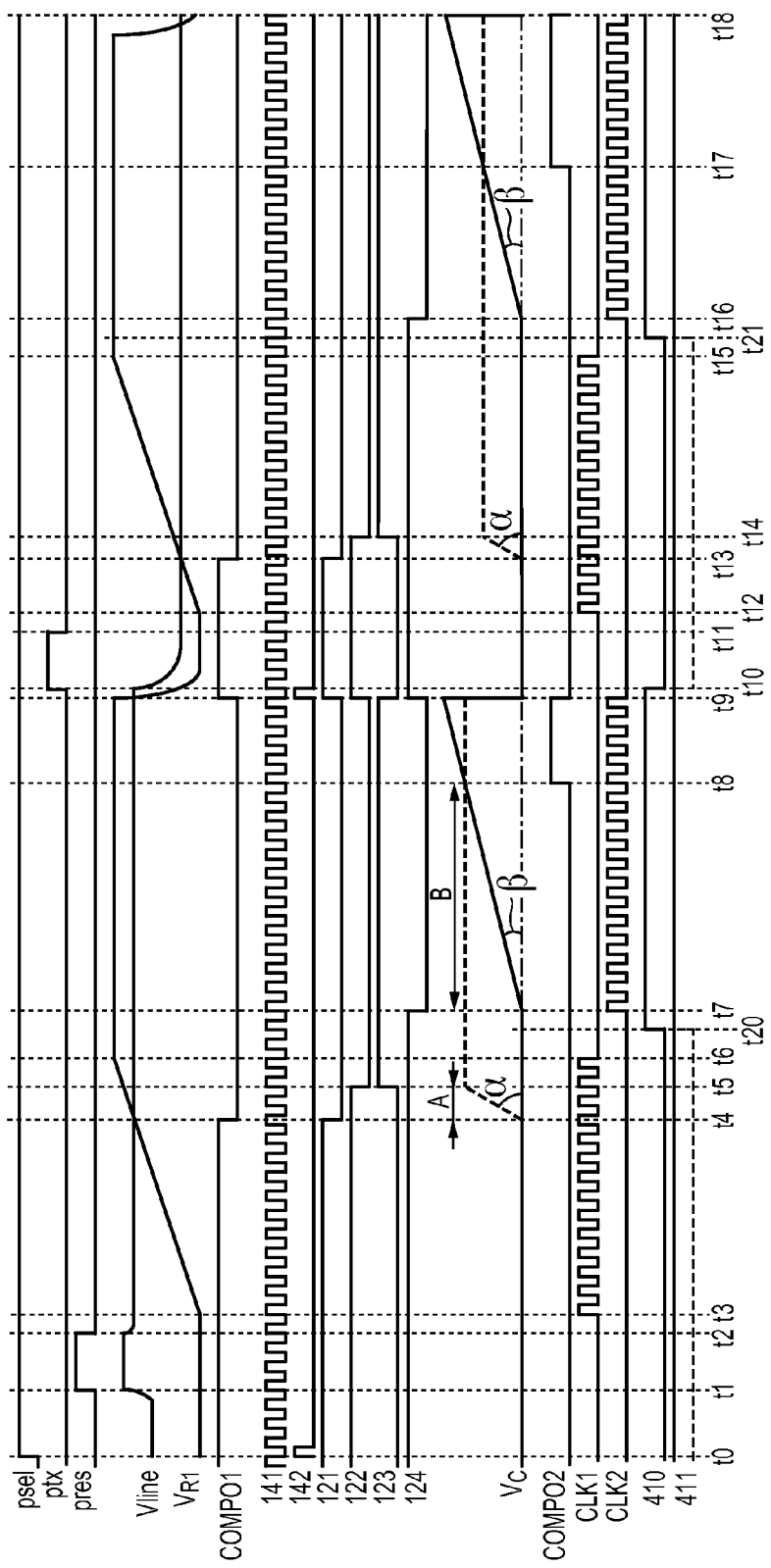
FIG. 10 is a timing chart for explaining a driving method for the solid-state image sensing device according to the fourth embodiment.

As indicated by a broken line in FIG. 10, if the control pulse 411 is set at L level during the time t0 to t20, the transistor 111 supplies the current I3 during the time t0 to t20. If the control pulse 411 changes from L level to H level (L→H) at the time t20, the current supplied by the transistor 111 becomes the current I1. According to the above ratio, the current supplied by the transistor 111 decreases to 1/8. In this case, the relationship between α and β is represented by:

$$\beta = \alpha/8 \quad (8)$$

where C1:C2=1:1.

That is, it is possible to control the second charging period to be predetermined times (four or eight times in the above example) longer than the first charging period by controlling the current supplied by the transistor 111. It is, for example, possible to change the accuracy of AD conversion by controlling the current supplied by the transistor 111 according to a shooting mode.

As in the first embodiment, it is possible to perform 2-bit AD conversion as AD conversion by the second ADC by measuring the count of the second charging period as AD conversion by the second ADC. Since the second charging period is longer than the first one, it is possible to count the second charging period as AD conversion.

According to the fourth embodiment, the accuracy of AD conversion by the second ADC is determined according to the current ratio I1:I2 (or I1:I3). A circuit for generating a current ratio is not a column circuit, and is thus hardly influenced by a decrease in power supply voltage due to the above-described line resistance. It is, therefore, possible to obtain a stable current ratio with which a gate-to-source voltage $V_{GS}$ is readily kept constant. A variation in current due to an excessive variation in power supply voltage only occurs at the time t20 when the first charging period is switched to the second one.

As described above, the second ADC can perform AD conversion which is hardly influenced by a variation in current. Furthermore, it is possible to switch the resolution of AD conversion by the second ADC according to a required resolution.

Note that the ratio between the first and second charging periods is set according to the capacitance ratio in the third embodiment or according to the current ratio in the fourth embodiment. The ratio between the charging periods may be controlled by combining the above setting methods.

Note that the transistors 401 and 404 for current switching are arranged for the transistor 136. A transistor for current switching, however, may be arranged for each column. This is because although a variation in current is suppressed when switching a current supply destination at the time t5 and a variation in power supply voltage occurs when switching a current supply destination at the time t20, the operation is executed for all the columns at the same time, and thus no variation occurs for each column.

FIG. 10 shows a case in which the control pulse 410 changes from H level to L level (H→L) at the time t10. This timing, however, is not limited to this. This may be done at any time during a period from when reset level conversion ends until conversion at a photoelectric conversion level starts, that is, during the time t9 to t12.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-026421, filed Feb. 9, 2012, which is hereby incorporated by reference herein in its entirety.

What is claimed is:

1. A solid-state image sensing device comprising:
a pixel configured to output a pixel signal;
a first conversion unit configured to convert the pixel signal into a digital signal with a first bit length; and
a second conversion unit configured to convert, into a digital signal with a second bit length, an analog signal obtained by subtracting, from the pixel signal, an analog signal corresponding to the digital signal with the first bit length,
wherein the second conversion unit comprises a current source, a first capacitance, and a switching unit for switching a flow of current supplied from the current source to at least one of the first capacitance and a reference potential, and performs the conversion based on comparison between a reference voltage and the analog signal which is charged in the first capacitance and is obtained as a subtraction result.

2. The device according to claim 1, wherein during a period from when the first conversion unit completes conversion until the second conversion unit starts conversion, a period during which the current supplied from the current source charges the first capacitance is equal to or longer than one cycle of an operation clock of the first conversion unit.

3. The device according to claim 1, wherein the second conversion unit further comprises a second capacitance, and the switching unit switches the flow of current to one of the first capacitance, the second capacitance, and the reference potential.

4. The device according to claim 3, wherein the second conversion unit generates the reference voltage for each column of pixels by charging the second capacitance with the current supplied from the current source.

5. The device according to claim 3, wherein during a period from when the first conversion unit completes conversion until the second conversion unit starts conversion, a period during which the current supplied from the current source charges the first capacitance is shorter than a period during which the current supplied from the current source charges the second capacitance.

6. The device according to claim 3, wherein the capacitance value of the first capacitance is smaller than the capacitance value of the second capacitance.

7. The device according to claim 3, further comprising a control unit configured to control the current source to decrease a current value supplied from the current source during a period when the second capacitance is charged, as compared with a current value supplied from the current source during a period when the first capacitance is charged.

8. The device according to claim 1, further comprising a third conversion unit configured to subtract, from the pixel signal, the analog signals corresponding to the digital signals with the first bit length and the second bit length after the conversion by the second conversion unit, and convert an analog signal as a subtraction result into a digital signal with a third bit length.

9. The device according to claim 1, wherein the pixel comprises a photoelectric conversion unit, an amplification transistor for outputting a pixel signal based on an electric charge generated by the photoelectric conversion unit, and a reset transistor for resetting a gate portion of the amplification transistor, and wherein the solid-state image sensing device reads out a reset level at which the gate portion is reset and a signal level based on the electric charge generated by the photoelectric conversion unit, executes a correlation double sampling operation using the reset level and the signal level, and subtracts an amount of offset charge charged together with the first capacitance and the second capacitance in the correlation double sampling operation.

* * * * *